(12) United States Patent
Morris et al.

(10) Patent No.: US 6,313,523 B1
(45) Date of Patent: Nov. 6, 2001

(54) IC DIE POWER CONNECTION USING CANTED COIL SPRING

(75) Inventors: Terrel L. Morris, Garland; David M. Chastain, Plano, both of TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/429,512

(22) Filed: Oct. 28, 1999

(51) Int. Cl.[7] ............................ H01L 23/48; H01R 9/09
(52) U.S. Cl. .................... 257/696; 257/694; 257/690; 439/66; 439/80
(58) Field of Search ............................ 257/690, 692, 257/693, 694, 695, 696; 439/66, 80

(56) References Cited

U.S. PATENT DOCUMENTS

| | | | |
|---|---|---|---|
| 3,921,201 | * 11/1975 | Eisele et al. | 257/672 |
| 4,830,979 | * 5/1989 | Crowe et al. | 174/52.3 |
| 5,638,596 | 6/1997 | McCormick | 29/827 |
| 6,174,172 | * 1/2001 | Kazama | 439/66 |

* cited by examiner

Primary Examiner—Jhihan B Clark

(57) ABSTRACT

A semiconductor device assembly according to the present invention may comprise a semiconductor die having at least one contact pad thereon and a package substrate having at least one lead pad thereon. The package substrate is sized to receive the semiconductor die so that the contact pad on the semiconductor die is substantially aligned with the lead pad on the package substrate when the semiconductor die is positioned on the package substrate. A coil spring is positioned between the contact pad on the semiconductor die and the lead pad on the package substrate so that the axis of the coil spring is substantially parallel to the contact pad contained on the semiconductor die and the lead pad contained on the package substrate.

15 Claims, 3 Drawing Sheets

IC DIE POWER CONNECTION USING CANTED COIL SPRING

FIELD OF THE INVENTION

This invention relates to packaging devices for semiconductor die in general and more specifically to electrical conductors for connecting a semiconductor die to leads contained in a semiconductor package substrate.

BACKGROUND

Semiconductor devices or die are typically contained within a larger housing or "package" which provides mechanical support for the semiconductor die and also protects it from physical damage. A typical semiconductor package includes an area sized to receive the semiconductor die, commonly referred to as a "window" and is provided with one or more (and typically tens or hundreds) of leads or circuit paths which allow the semiconductor die placed within the window of the package to be electrically connected to leads or terminals located on exterior portions of the package. The resulting semiconductor device assembly (i.e., the package and die) may then be mounted to a suitable printed circuit board (PCB) by any of a wide range of processes well known in the art.

Several different methods have been developed over the years to electrically connect the various input or output (I/O) terminals or "pads" on the semiconductor die to the corresponding leads provided on the package substrate. For example, one method, generically referred to as wire bonding, individually connects each of the I/O pads on the die with the various leads provided on the package with a very fine wire (e.g., wire having a diameter of about 18 microns or so). The wires are bonded or welded, one at a time, to the pads on the semiconductor die and on the package substrate using a special tool, such as a wedge or a capillary, and a combination of heat, pressure, and/or ultrasonic energy. These processes are generically referred to as thermocompression or thermosonic bonding.

Although the wire bonding process was originally done manually, with the operator's skill controlling every aspect of the bonding process, it has progressed rapidly to a fully automated process as the density of I/O connections has increased. In the automated wire bonding process, an automatic wire bonding machine senses the locations of the I/O pads on both the semiconductor die and the package substrate and then automatically connects the appropriate pads with the fine wire. Such automated wire bonding processes are well-developed and have kept pace with the ever increasing number of connections and shrinking bond pad sizes on the semiconductor die. For example, it is not uncommon to bond semiconductor die requiring 300 connections and having two rows of alternating perimeter bonding pads with pad sizes as small as 50×50 $\mu$m (2×2 mils) with 100 $\mu$m (4 mils) between on-row pad centers.

Other techniques that may be used to electrically connect the semiconductor die to the package substrate include, but are not limited to, tape automated bonding (TAB) processes and any of a variety of the newer so-called "flip chip" processes.

While the foregoing device architectures and methods for electrically connecting the semiconductor die to the various leads provided on the package substrate work well and are being used, continuing developments in integrated circuit technology are resulting in semiconductor die having an ever increasing number of I/O pads as well ever increasing and substantial current requirements. For example, a 40 watt device operating at 5 volts requires 8 amperes of supply current, whereas the same device operating at 2 volts requires 20 amperes of supply current. Since most die architectures require that such power be provided to the die at locations near the center of the chip, and not at the periphery, where the I/O bond pads are typically located, it has proven difficult to provide the required high current supply paths. That is, since the wires used in the wire bonding process are extremely fine (typically about 18 microns in diameter), a single wire cannot be used to carry the high currents required by some of the newer, higher powered semiconductor die.

One method that has been used in the past to overcome the limited current carrying ability of the bond wires is to utilize a plurality of wires arranged in parallel to provide redundant supply current and ground paths for the semiconductor die. While such parallel redundant wiring techniques are effective from a functional standpoint, they require many redundant bond pad sites, which reduces by a like amount the number of bond pad sites available for device I/O. Other problems relating to the use of multiple redundant bond wires to supply the operating current to the die include, but are not limited to, problems relating to resistive power losses in the wires, high inductance, signal cross-talk, and capacitance effects.

While the newly developed "flip chip" processes ameliorate some of the foregoing problems by providing shorter die-to-package connections, some of the gains are offset by the consequent difficulties the flip chip architecture imposes on the wiring contained in the package substrate. That is, it is still necessary to provide a relatively large circuit path through the highly nested wiring contained on the package substrate in order to provide the required power and ground connections to the face of the semiconductor die. Another problem is that flip chip processes typically require specially designed fabrication devices and jigs which are not currently widely used.

Consequently, a need remains for semiconductor package assembly capable of providing the relatively high currents required by some of the newer, higher powered semiconductor devices while at the same time minimizing resistive power losses, as well as problems resulting from high inductance, signal cross-talk, and capacitance effects that are typically associated with currently available parallel bond wire architectures. Additional advantages could be achieved if such an improved package assembly could be fabricated with currently available semiconductor package fabrication devices and jigs.

SUMMARY OF THE INVENTION

A semiconductor die according to the present invention may comprise a generally planar substrate having a contact pad positioned on the first side of the semiconductor die. A coil spring is attached to the contact pad on the semiconductor die so that the axis of the coil spring is generally parallel to the first side of the semiconductor die.

A semiconductor device assembly according to the present invention may comprise a semiconductor die having at least one contact pad thereon and a package substrate having at least one lead pad thereon. The package substrate is sized to receive the semiconductor die so that the contact pad on the semiconductor die is substantially aligned with the lead pad on the package substrate when the semiconductor die is positioned on the package substrate. A coil spring is positioned between the contact pad on the semiconductor die and the lead pad on the package substrate so that the axis of the coil spring is substantially parallel to the contact pad contained on the semiconductor die and the lead pad contained on the package substrate.

Also disclosed is a method for connecting a contact pad on a semiconductor die with a lead pad on a package substrate that comprises the steps of: Positioning a coil spring having at least one coil on the contact pad on the semiconductor die; placing the semiconductor die adjacent the package substrate so that the coil spring is substantially aligned with the lead pad on the package substrate; urging the semiconductor die and package substrate together to compress the coil spring and create a pre-load condition; and holding the semiconductor die in a fixed position with respect to the package substrate so as to maintain the pre-load condition.

A method for forming a coil spring on a contact pad according to the present invention may comprise the steps of: Attaching a proximal end of a wire to the contact pad; moving the wire in three-dimensional space to produce a first coil, the first coil extending generally outwardly from the contact pad; and attaching the wire to the contact pad.

BRIEF DESCRIPTION OF THE DRAWING

Illustrative and presently preferred embodiments of the invention are shown in the accompanying drawing in which.

DETAILED DESCRIPTION OF THE INVENTION

Figure 1:
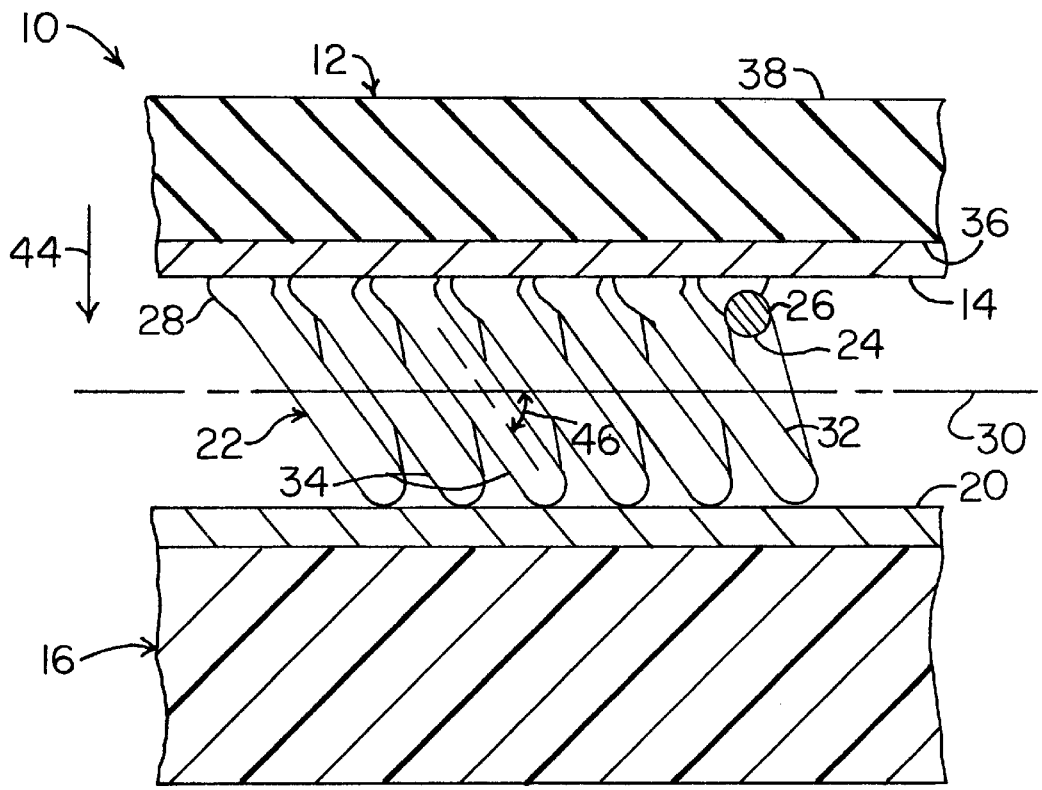
FIG. 1 is an enlarged cross-sectional view in elevation of a portion of one embodiment of the semiconductor device assembly according to the present invention.
Figure 2:
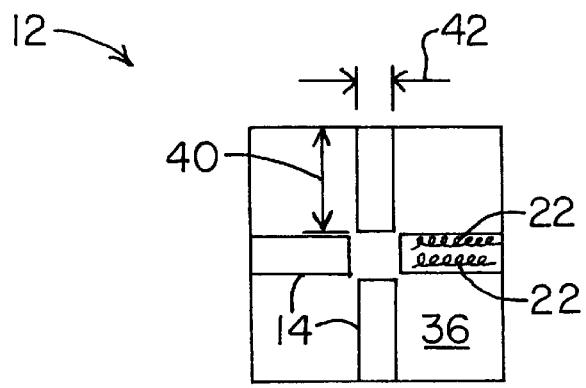
FIG. 2 is a plan view of one side of a semiconductor die showing the positions and orientations of a plurality of contact pads formed thereon.
Figure 3:
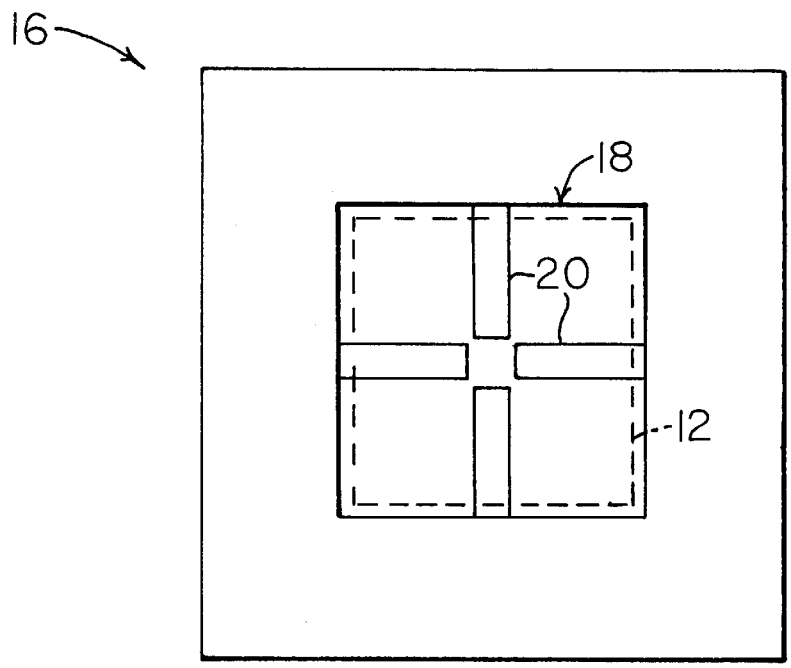
FIG. 3 is a plan view of a package substrate showing the window and the positions and orientations of a plurality of lead pads formed thereon.

A semiconductor device assembly 10 according to one preferred embodiment of the present invention is best seen in FIGS. 1–3 and may comprise a semiconductor die 12 which may be provided with one or more contact pads 14 thereon in order to provide electrical power to the semiconductor die. The semiconductor device assembly 10 may also include a package or substrate 16 having a recessed area or "window" 18 therein that is suitable for receiving the semiconductor die 12, as best seen in FIG. 3. The package or substrate 16 may be provided with one or more lead pads 20 thereon which are sized and positioned so that they will be substantially aligned with the contact pads 14 contained on the semiconductor die 12 when the semiconductor die 12 is positioned within the window 18 of package 16.

Each contact pad 14 provided on the semiconductor die 12 is electrically connected to the corresponding lead pad 20 positioned on the package or substrate 16 by one or more coil springs 22. Each coil spring 22 may be substantially identical to the others and may comprise a continuous wire 24 having a proximal end 26 and a distal end 28. The wire 24 may be helically wound around a spring axis 30 in a manner similar to those used to form conventional coil springs. In one preferred embodiment, the coil spring 22 may be formed "on-the-fly" by a conventional wire bonding machine (not shown). However, in other embodiments of the invention, the spring 22 may be pre-formed and then later attached to the contact pads 14, as will be described in greater detail below. It is generally preferred, but not required, that each spring 22 be attached to the contact pad 14 on the semiconductor die 12. Alternatively, the spring 22 could be attached to the lead pad 20 on the package substrate 16.

If the coil spring 22 is to be formed "on-the-fly" by a wire bonding machine (not shown), the first step in the spring forming process is to attach the proximal end 26 of the wire 24 to the contact pad 14 on the semiconductor die 12. The proximal end 26 of the wire 24 may be attached to the contact pad 14 according to any convenient process known in the wire bonding art, such as, for example, by thermocompression or thermosonic bonding. Thereafter, the capillary (not shown) of the wire bonding machine is moved in three dimensions as necessary to form the first loop or coil 32 of spring 22. This first loop or coil 32 may also be attached to the contact pad 14 on the semiconductor die 12 (e.g., by thermocompression or thermosonic bonding), as best seen in FIG. 1. The wire bonding machine (not shown) may continue to form the individual loops or coils 34 of spring 22, attaching each individual loop or coil 34 to the contact pad 14 on the die 12 as it is formed. After a sufficient number of coils 34 have been laid down on the contact pad 14, the wire bonding machine may break the wire 24 after the last bond, thereby forming the distal end 28 of spring 22.

As will be discussed in greater detail below, it is generally preferred, but not required, to form the spring 22 so that the various coils 34 thereof are canted or angled in the same direction with respect to the spring axis 30. That is, as used herein, the term "canted" refers to spring configurations wherein the coils 34 are always inclined in the same direction with respect to the spring axis 30. So canting the spring 22 allows it to be more easily compressed in the transverse direction (indicated by arrow 44), thereby allowing the spring 22 to be "pre-loaded" during assembly of the semiconductor device assembly 10. Such pre-loading of the spring 22 ensures that substantially all of the individual coils 34 of spring 22 will make contact with the lead pad 20 on the package substrate 16, thereby improving electrical performance.

After the desired number of springs 22 have been formed and secured to the various contact pads 14 of the semiconductor die 12, the semiconductor die 12 may be mounted to the package substrate 16 to form the completed semiconductor device assembly 10 according to the present invention. Briefly, the mounting process may involve the step of first placing the die 12 within the window 18 of the package 16. See FIG. 3. Once the die 12 has been properly positioned within the window 18, the springs 22 will make contact with the various corresponding lead pads 20 provided on the package substrate 16. Thereafter, the chuck (not shown) that is used to position the die 12 within the window 18 also may move the die 12 downward slightly (i.e., toward the package substrate 16) in order to slightly compress the spring or springs 22. So compressing the spring or springs 22 produces the spring pre-load referred to above. A suitable die attach material (not shown), such as epoxy, then may be injected into the space between the die 12 and the package substrate 16 in order to secure the die 12 to the package substrate 16 and to maintain the spring pre-load. At this point, the remaining I/O pads (not shown) contained on the semiconductor die 12 may be attached to the appropriate leads (also not shown) provided on the package substrate 16 according to any of a wide range of processes (e.g., wire bonding) that are well-known in the art.

A significant advantage of the present invention is that it solves the problem of providing a high current path to a semiconductor die, but without requiring the use of multiple input/output pads on the die to provide the redundant current paths required for high current operation. Another advantage of the present invention is that the coil springs 22 used to provide supply power to the semiconductor die may be positioned at any convenient location on the die 12 where the power is required. The ability to locate the electrical connections at those portions of the semiconductor die where the power is required reduces the inductive, signal cross-talk and/or noise problems that are typically associated with long wire runs. The relatively short current paths, as well as the large number of parallel current paths, that are provided by the spring coils also reduces resistive power losses. Still yet another advantage of the present invention is that the springs 22 may be formed "on-the-fly" by conventional and readily available wire bonding equipment.

Additional advantages associated with the present invention include the ability to move and remove the semiconductor die 12 with respect to the package substrate 16. For example, the arrangement of the springs 22 and lead pads 20 allows the semiconductor die 12 to be moved by a substantial amount with respect to the package substrate 16, yet still maintain good electrical contact. That is, the present invention reduces the alignment tolerance required by the power connections, thereby allowing the semiconductor die 12 to be positioned on the package substrate 16 based on the alignment requirements of the I/O pads, rather than on the alignment requirements of the power and ground paths. Further, the spring contact method available with the present invention allows the die 12 to be removed and/or repositioned many times with respect to the package substrate 16, which may be required or desirable in certain applications.

Having briefly described the semiconductor device assembly 10, as well as some of its more significant features and advantages, the various embodiments of the semiconductor device assemblies according to the present invention will now be described in detail. However, before proceeding with the description, it should be noted that the term "semiconductor die" as used herein refers to a silicon or other semiconductor integrated circuit or "chip" that contains circuitry and bond pads on one or more sides of the semiconductor die. The term "semiconductor device assembly" refers to the semiconductor die and the associated package that contains at least the semiconductor die, including any external package leads, pins, or balls that may be used to connect the semiconductor device assembly to a socket or to a printed circuit board. In addition to the architecture described above, the semiconductor package may also be configured to receive additional circuit components, or even other semiconductor die, such as is the case with the so-called multi-chip module (MCM) architecture. Consequently, the present invention should not be regarded as limited to the particular package configurations and architectures shown and described herein.

With the foregoing considerations in mind, one embodiment 10 of a semiconductor device assembly is best seen in FIGS. 1–3 and may comprise a generally planar semiconductor die 12 having a first or lower surface 36 and a second or upper surface 38. It should be noted that the terms "upper" and "lower" as used herein are relative terms only and refer to the orientations of the surfaces shown in the appended drawing. Since other orientations are possible, the terms "upper" and "lower" should not be regarded as limiting the invention. The semiconductor die 12 may be provided with one or more contact pads 14 on the lower surface 36 which, in one preferred embodiment, are utilized to provide power and ground paths for the circuitry contained in the semiconductor die 12. See FIG. 2. The contact pads 14 provided on the lower surface 36 of die 12 may be metallized according to current practice in order to provide an electrically conductive surface. Since any of a wide range of metals and metal alloys may be used to form the metallized contact pads 14 contained on the semiconductor die 12, the present invention should not be regarded as limited to any particular metallic material formed according to any particular process. By way of example, in one preferred embodiment, the contact pads 14 may comprise an aluminum alloy and may be formed by according to a sputtering process. However, since processes for forming such metallized contacts on semiconductor die are well known in the art, and since persons having ordinary skill in the art could readily select an appropriate material and process after having become familiar with the teachings of the present invention, the material and process that are used to form the metallized contact pads 14 in one preferred embodiment of the invention will not be described in further detail herein.

As was briefly described above, the second or upper surface 38 of die 12 also may be provided with one or more additional contact or I/O pads (not shown) in order to allow corresponding input and output signals to be communicated to and from the circuitry contained on the semiconductor die 12. However, since I/O pads, as well as processes for forming such I/O pads, are well-known in the art and since a detailed description of such pads and forming processes is not necessary in order to understand or practice the present invention, the I/O pads which may be provided on the upper surface 38 of die 12 will not be described in further detail herein.

The package 16 for receiving the semiconductor die 12 is best seen in FIG. 3 and may comprise a generally rectangularly shaped member, although other shapes are possible. Alternatively, the package 16 may even comprise the type associated with the multi-chip module (MCM) architecture described above. In any event, and regardless of its particular configuration or intended application, the package 16 may be provided with a recessed area or "window" 18 that is sized to receive the semiconductor die 12 that is to be housed within the package 16. The package 16 also may be provided with one or more lead pads 20 that are sized and spaced within the window 18 so that they will be substantially aligned with the contact pads 14 provided on the bottom surface 36 of the semiconductor die 12. As was the case for the contact pads 14 provided on the semiconductor die 12, the lead pads 20 contained on the package 16 may be metallized in order to provide a conductive surface or "pad" suitable for making electrical contact with the springs 22. Any of a wide range of metals and metal alloys deposited according to any of a wide range of processes may be used to form the metallized lead pads 20 contained on the package substrate 16. Consequently, the present invention should not be regarded as limited to lead pads 20 comprising any particular metallic material and formed according to any particular process. However, by way of example, in one preferred embodiment, the lead pads 20 provided on the package substrate 16 may comprise a nickel-gold alloy and may be formed according to a plating process.

The package substrate 16 may also be provided with any number of additional leads (not shown), such as, for example, leads suitable for connecting with the various I/O pads (also not shown) which may be provided on the upper surface 38 of semiconductor die 12 in the manner already described. However, since such semiconductor packages are well known in the art and could be easily fabricated by persons having ordinary skill in the art after having become familiar with the teachings of the present invention, the particular semiconductor package 16 that may be utilized in one preferred embodiment of the present invention will not be described in further detail herein.

The semiconductor device assembly 10 may be provided with one or more coil springs 22 which electrically connect the contact pads 14 on the semiconductor die 12 with the corresponding lead pads 20 provided on the package substrate 16. For example, in the embodiment shown in FIG. 2, the lower surface 36 of semiconductor die 12 is provided with four separate contact pads 14 arranged substantially in the form of a "+" symbol. Alternatively, other arrangements are possible, as will be described in greater detail below. Each contact pad 14 has a length 40 and a width 42. In one preferred embodiment, the width 42 of each contact pad 14 is sufficient to accommodate two coil springs 22 positioned side by side, substantially in the manner illustrated in FIG. 2. Since it is preferred that the corresponding lead pads 20 provided on the package substrate 16 have substantially the same size and shape as the contact pads 14 on the semiconductor die 12, the two springs 22 affixed to the contact pad 14 on the semiconductor die 12 will also contact substantially the entirety of the lead pad 20 provided on the package substrate 16.

Before proceeding with the description it should be noted that the contact pads 14 provided on the semiconductor die 12 may be provided with any number of springs 22 having any convenient number of individual coils 34. Generally speaking, the number of individual springs 22, the number of coils 34 per spring, and the size (i.e., diameter) of the spring wire 24 should be selected so that the spring 22 will be capable of supplying the current required by the particular semiconductor die 12. That is, since each coil 34 of the spring 22 provides two current paths between the lead pad 20 and the contact pad 12, a person desiring to practice the present invention should select the foregoing parameters (e.g., number springs 22, number of coils 34 per spring 22, and spring wire size) so that each coil 34 can safely carry its portion of the expected current without danger of overheating.

By way of example, and without limiting the scope of the present invention, in one preferred embodiment, each spring 22 may be formed from wire 24 having a diameter in the range of about 20 microns to about 30 microns (25 microns preferred). The spring 22 may be formed so that it includes approximately 10 coils per millimeter, with each coil 34 having a diameter in the range of about 100 microns to about 150 microns (125 microns preferred).

It should also be noted that the particular material comprising the wire 24 from which the spring 22 is formed should be selected so that it is compatible, at least from a metallurgical standpoint, with the material or materials forming the metallized contact and lead pads 14 and 20. Since a wide range of metals and metal alloys may be utilized to form the metallized contact and lead pads 14 and 20, as well as to form spring 22, and since persons having ordinary skill in the art will readily recognize those materials that are metallurgically compatible and those that are not, the present invention should not be regarded as limited to any particular material or combinations of materials. However, by way of example, in one preferred embodiment, the wire 24 used to form spring 22 may comprise gold.

Continuing now with the description and with reference primarily to FIG. 1, each coil spring 22 may be substantially identical to the others and may comprise a continuous wire 24 having a proximal end 26 and a distal end 28. The wire 24 is helically wound around a spring axis 30 in the manner of a conventional coil spring and, in one preferred embodiment, is formed "on-the-fly" by a wire bonding machine (not shown). The first step in the spring forming process is to attach the proximal end 26 of the wire 24 to the contact pad 14 on the semiconductor die 12. The proximal end 26 of wire 24 may be attached to the contact pad 14 by the wire bonding machine (not shown) by any of a wide range of processes that are now known in the art (e.g., by thermocompression or thermosonic bonding) or that may be developed in the future. After the proximal end 26 of wire 24 has been successfully bonded to the contact pad 14, the capillary (not shown) of the wire bonding machine is moved in three dimensions as necessary to form the first loop or coil 32 of spring 22. Since the capillary of a wire bonding machine is moveable in three dimensions and since the motion thereof is generally computer controlled, it is a simple matter for a user (not shown) to program the wire bonding machine to form the various loops or coils 34 of spring 22. That is, since persons having ordinary skill in the art could readily program a wire bonding machine to form the coils 34 of the spring 22 after having become familiar with the teachings of the present invention, the particular process that may be used with one particular wire bonding machine to form the spring coils 34 will not be described in greater detail below.

After the first coil 32 is formed, it may also be attached to the contact pad 14 on the semiconductor die 12 by any convenient bonding process (e.g., by thermocompression or thermosonic bonding). The wire bonding machine (not shown) may continue to form the individual loops or coils 34 of spring 22, attaching each individual coil 34 to the contact pad 14 on the die 12. After a sufficient number of coils 34 have been laid down, the wire bonding machine may break the wire 24 after the last bond, thereby forming the distal end 28 of spring 22.

As was briefly discussed above, it is generally preferred, but not required, to form the spring 22 so that the various coils 34 thereof are canted in the same direction with respect to the spring axis 30. That is, so that all of the individual coils 34 are always inclined in the same direction with respect to the spring axis 30. For example, in the embodiment shown in FIG. 1, each of the coils 34 is inclined with respect to the axis 30 so that the coils slope generally downwardly from left to right. If the coils were not canted, the "front" portions of the coils (i.e., the portions of the coils that are closest to the observer) would slope in one direction while the "rear" portions of the coils (i.e., those portions of the coils located behind the front portions) would slope in the opposite direction. Forming the coil spring 22 so that it is so canted allows the spring 22 to be more easily compressed in the cross or transverse direction (indicated by arrow 44) to produce the desired "pre-load." As mentioned above, pre-loading the spring 22 in the transverse direction 44 ensures that substantially all of the individual coils 34 of spring 22 will make contact with the lead pad 20 on the package 16. The amount of cant (i.e., cant angle 46) that may be provided to the spring 22 is not particularly critical, and any of a wide range of cant angles may be regarded as within the scope of the present invention. By way of example, in one preferred embodiment, the cant angle 46 may be selected to be in the range of about 45 degrees to about 75 degrees.

After the desired number of springs 22 have been formed and secured to the various contact pads 14 of the semiconductor die 12, the semiconductor die 12 may be mounted to the package substrate 16 to form the completed semiconductor device assembly 10 according to the present invention. The first step in the mounting process is to place the die 12 within the window 18 of the package 16. This step may be performed with the aid of equipment and devices, such as a chuck (not shown), that are known in the art for positioning semiconductor die within corresponding package windows. Once the die 12 has been positioned within the window 18, the various springs 22 provided on the die 12 will make contact with the various corresponding lead pads 20 provided on the package substrate 16. The device (e.g., chuck) used to position the die 12 within the window 18 may then urge the die 12 toward the package 16 to introduce a slight amount of "pre-load" in the springs 22. The pre-load helps to ensure that substantially all of the loops or coils 34 of the springs 22 make good electrical contact with the contact and lead pads 14 and 20. Thereafter, any of a wide range of die attach materials (not shown), such as, for example epoxy, or a polyimide or silicone adhesive, may be injected into the space between the die 12 and the package 16. The die attach material secures the die 12 within the package 16, thereby ensuring that the spring pre-load is retained. Alternatively, other methods of applying the die attach material could also be used, as would be obvious to persons having ordinary skill in the art after having become familiar with the teachings of the present invention. For example, the die attach material may be deposited on the package substrate 16 before the die 12 is moved into position within the window 18. In any event, after the die 12 is secured within the window 18, the remaining I/O pads (not shown) contained on the semiconductor die 12 may be attached to the appropriate leads (also not shown) provided on the package 16 according to any of a wide range of processes (e.g., wire bonding) well-known in the art or that may be developed in the future.

Figure 4:
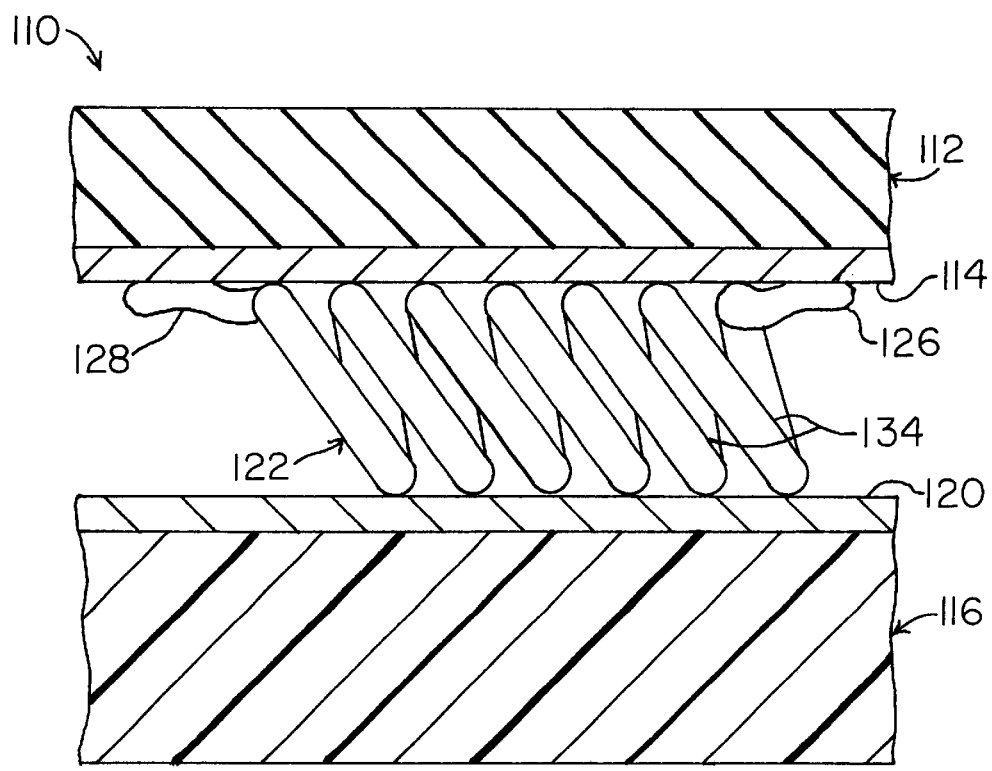
FIG. 4 is an enlarged cross-sectional view in elevation of a portion of a second embodiment of the semiconductor device assembly according to the present invention.

As described above, the coil spring 22 that is used to electrically connect the contact pad 14 with the lead pad 20 may be formed "on-the-fly" by a wire bonding machine. However, other arrangements are possible. For example, with reference now to FIG. 4, a second embodiment 110 of a semiconductor device assembly may be provided with a pre-formed coil spring 122. The preformed coil spring 122 may then be attached to the contact pad 114 provided on the semiconductor die 112. In the embodiment shown in FIG. 4, only the proximal and distal ends 126 and 128 are bonded to the contact pad 114. The remaining coils 134 are urged against both the contact pad 114 and lead pad 120 contained on the package substrate 116 by slightly compressing the spring 122 to form the pre-load described above for the first embodiment. The proximal and distal ends 126 and 128 of pre-formed spring 122 may be bonded to the contact pad 114 by any of a wide range of processes (e.g., thermosonic or thermocompression bonding) that are currently well-known in the art or that may be developed in the future for bonding such materials.

Figure 5:
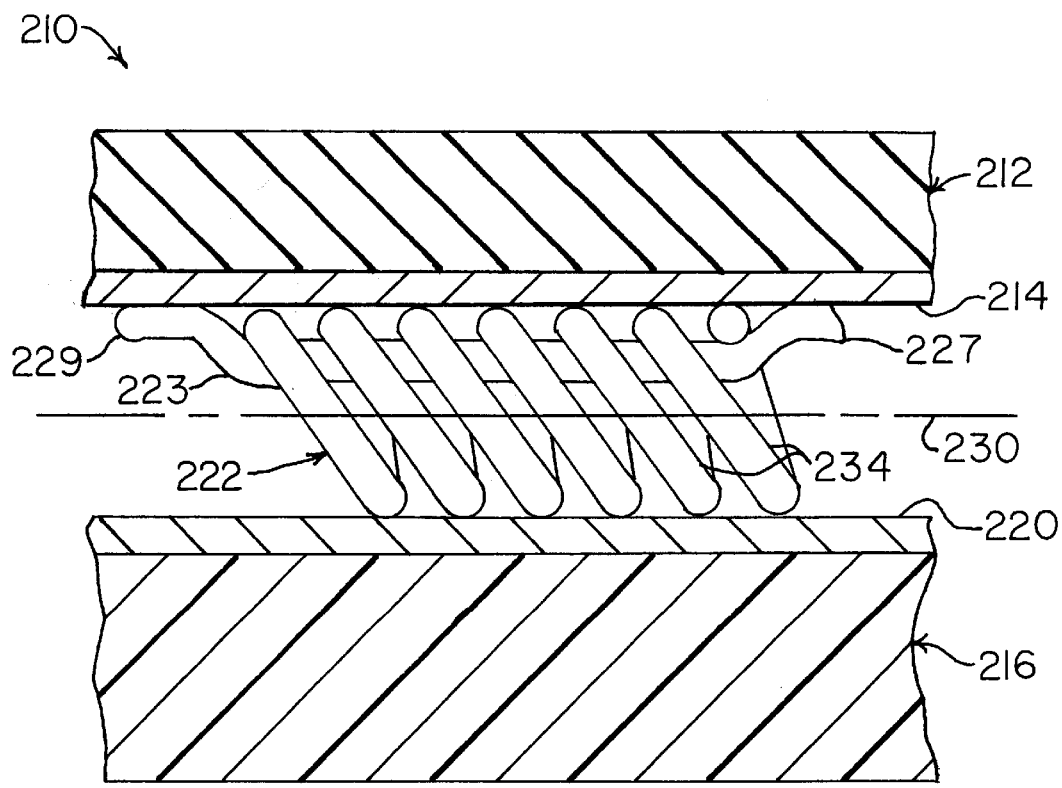
FIG. 5 is an enlarged cross-sectional view in elevation of a portion of a third embodiment of the semiconductor device assembly according to the present invention.

Still other arrangements are possible. For example, a third embodiment 210 of a semiconductor device assembly also may be provided with a pre-formed coil spring 222, as best seen in FIG. 5. However, in this third embodiment 210, the pre-formed coil spring 222 may be attached to the contact pad 214 on die 212 by a separate bond wire 223. The bond wire 223 may extend through the various coils 234 of spring 222 so that the bond wire 223 is generally parallel to the spring axis 230. The proximal and distal ends 227 and 229 of bond wire 223 may be bonded to the contact pad 214 on die 212 by any of a wide range of processes, such as, for example, by thermosonic or thermocompression bonding techniques. Since the various coils 234 of the spring 222 are not individually bonded to either the contact pad 214 or the lead pad 220 contained on the package substrate 216, it will usually be necessary to slightly compress the spring 222 during assembly of the semiconductor device assembly 210 to produce the pre-load described above. The spring pre-load helps to ensure that each individual coil 234 of spring 222 will make good electrical contact with the respective pads 214 and 220.

Figure 6:
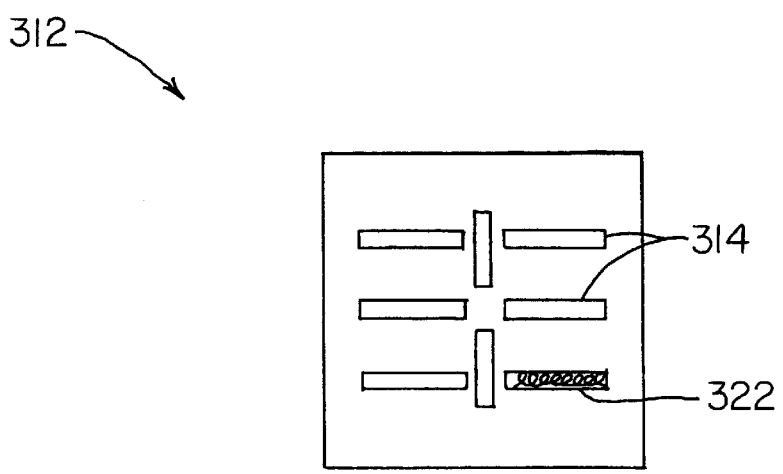
FIG. 6 is a plan view of one side of a semiconductor die having an alternate arrangement of contact pads formed thereon.

Finally, and as was mentioned above, the various contact pads (e.g., 14) provided on the die (e.g., 12) may comprise any of a wide range of configurations. For example, with reference now to FIG. 6, another embodiment 312 of a semiconductor die may comprise eight (8) individual contact pads 314 arranged substantially as shown in FIG. 6. A single spring 322 may be provided on each separate contact pad 314 (only a single spring 322 is shown in FIG. 6 for clarity). Of course, the lead pads (not shown) provided on a mating package substrate (also not shown) would be arranged in a similar configuration so that the lead pads (not shown) would be substantially aligned with the corresponding contact pads 314 provided on the die 312. The springs 322 provided on each contact pad 314 may comprise any of the embodiments shown and described above.

It is contemplated that the inventive concepts herein described may be variously otherwise embodied and it is intended that the appended claims be construed to include alternative embodiments of the invention except insofar as limited by the prior art.

What is claimed is:

1. A semiconductor device assembly, comprising:

a semiconductor die having at least one contact pad thereon;

a package substrate having at least one lead pad thereon, said package substrate being sized to receive said semiconductor die so that the contact pad on said semiconductor die is substantially aligned with the lead pad on said package substrate when said semiconductor die is positioned on said package substrate; and a coil spring having an axis, said coil spring positioned between the contact pad on said semiconductor die and the lead pad on said package substrate so that the axis of said coil spring is substantially parallel to the contact pad contained on said semiconductor die and the lead pad contained on said package substrate.

2. The semiconductor device assembly of claim 1, wherein said coil spring is attached to the contact pad on said semiconductor die.

3. The semiconductor device assembly of claim 1, wherein said coil spring comprises a proximal end and a distal end, the proximal and distal ends of said coil spring being attached to the contact pad on said semiconductor die.

4. The semiconductor device assembly of claim 1, wherein said coil spring comprises a proximal end, a distal end, and at least one coil, said semiconductor device assembly further comprising a bond wire having a proximal end and a distal end, said bond wire extending through the coil of said coil spring, generally along the axis of said coil spring, the proximal and distal ends of said bond wire being attached to the contact pad on said semiconductor die, said bond wire securing said coil spring to the contact pad of said semiconductor die.

5. The semiconductor device assembly of claim 1, wherein said coil spring comprises a canted coil spring.

6. The semiconductor device assembly of claim 2, wherein said semiconductor die includes a top surface and a bottom surface and wherein the contact pad is located on the bottom surface of said semiconductor die.

7. The semiconductor device assembly of claim 6, wherein said coil spring comprises at least one coil.

8. The semiconductor device assembly of claim 6, wherein said coil spring comprises at least two coils.

9. The semiconductor device assembly of claim 8, wherein at least one of the coils of said coil spring is attached to the contact pad on said semiconductor die.

10. The semiconductor device assembly of claim 8, wherein at least two of the coils of said coil spring are attached to the contact pad on said semiconductor die.

11. The semiconductor device assembly of claim 3, wherein said coil spring comprises at least two coils located between the proximal and distal ends.

12. A semiconductor die, comprising:
   a generally planar substrate having a first side and a second side;
   a contact pad positioned on the first side of said semiconductor die;
   a coil spring having an axis attached to the contact pad on said semiconductor die so that the axis of said coil spring is generally parallel to the first side of said semiconductor die.

13. The semiconductor die of claim 12, wherein said coil spring has a proximal end and a distal end, and wherein the proximal end of said coil spring is attached to the contact pad on said semiconductor die at a first location and wherein the distal end of said coil spring is attached to the contact pad on said semiconductor die at a second location.

14. The semiconductor die of claim 12, wherein said coil spring comprises at least one coil, wherein said at least one coil is attached to the contact pad on said semiconductor die.

15. The semiconductor die of claim 12, wherein said coil spring comprises a proximal end, a distal end, and at least one coil, said semiconductor die further comprising a bond wire having a proximal end and a distal end, said bond wire extending through the coil of said coil spring, generally along the axis of said coil spring, the proximal and distal ends of said bond wire being attached to the contact pad on said semiconductor die, said bond wire securing said coil spring to the contact pad of said semiconductor die.

* * * * *